United States Patent [19]

Noguchi et al.

[11] Patent Number: 4,902,356

[45] Date of Patent: Feb. 20, 1990

[54] EPITAXIAL SUBSTRATE FOR HIGH-INTENSITY LED, AND METHOD OF MANUFACTURING SAME

[75] Inventors: Masahiro Noguchi; Hideki Gotoh; Kenji Shimoyama, all of Ushiku, Japan

[73] Assignees: Mitsubishi Monsanto Chemical Company; Mitsubishi Kasei Corporation, both of Tokyo, Japan

[21] Appl. No.: 299,094

[22] Filed: Jan. 19, 1989

[30] Foreign Application Priority Data

Jan. 21, 1988 [JP] Japan .................................. 63-12355

[51] Int. Cl.$^4$ ............................................. H01L 21/20
[52] U.S. Cl. .......................... 148/33.4; 148/DIG. 72; 148/DIG. 101; 148/DIG. 108; 148/DIG. 110; 148/33.5; 156/610; 357/17; 437/86; 437/117; 437/127; 437/133; 437/905; 437/974
[58] Field of Search .................. 148/DIG. 15, 56, 65, 148/72, 95, 97, 99, 101, 108, 110, 169, 33, 33.1, 33.4, 33.5; 156/610–615; 427/252, 255.1; 357/16, 17; 437/81, 86, 105, 107, 114, 117, 119, 122, 126, 127, 133, 905, 974

[56] References Cited

U.S. PATENT DOCUMENTS

| Re. 29,648 | 5/1978 | Groves et al. | 357/17 |
|---|---|---|---|
| 3,636,617 | 1/1972 | Schmidt et al. | 437/127 |
| 3,823,043 | 7/1974 | Andre et al. | 437/86 |
| 3,981,073 | 9/1976 | Dally | 357/3 |
| 4,118,857 | 10/1978 | Wong | 437/86 |
| 4,269,635 | 5/1981 | Logan et al. | 437/117 |
| 4,329,189 | 5/1982 | Nood et al. | 437/117 |
| 4,468,850 | 9/1984 | Liau et al. | 156/649 |
| 4,477,294 | 10/1984 | Gutierrez et al. | 437/117 |
| 4,648,940 | 3/1987 | Menigaux et al. | 156/649 |
| 4,774,194 | 9/1988 | Hokuyou | 437/5 |

FOREIGN PATENT DOCUMENTS

| 0023391 | 2/1979 | Japan | 437/117 |
|---|---|---|---|
| 0035410 | 4/1981 | Japan | 437/117 |
| 0162033 | 9/1983 | Japan | 437/117 |

Primary Examiner—Brian E. Hearn
Assistant Examiner—William Bunch
Attorney, Agent, or Firm—Armstrong, Nikaido, Marmelstein, Kubovcik & Murray

[57] ABSTRACT

An epitaxial layer having a double-hetero structure is forming using an MOCVD process or an MBE process, and an epitaxial substrate is formed using an LPE process, thereby forming a substrate which exploits the distinguishing features of both processes. Since the MOCVD process or MBE process exhibits mixed-crystal ratio and film thickness controllability, excellent reproducibility and uniformity are obtained when forming the double-hetero structure on a compound semiconductor substrate. Since the growth process takes place under thermal non-equilibrium, the amount of impurity doping is raised to more than $10^{19}$ cm$^3$. This is advantageous in terms of forming an electrode contact layer. With the LPE process, the material dissolved in the melt is grown epitaxially on the substrate by slow cooling, and the rate of growth is high. This process is suitable for forming the substrate after removal of the compound semiconductor substrate. By virtue of this liquid phase epitaxy, an oxide film preventing layer is removed by raising the degree of unsaturation of the melt, the epitaxial layer is grown in a short period of time, and a high-quality, highly uniform epitaxial substrate can be quickly manufactured. It is also possible to reduce cost.

9 Claims, 1 Drawing Sheet

EPITAXIAL SUBSTRATE FOR HIGH-INTENSITY LED, AND METHOD OF MANUFACTURING SAME

BACKGROUND OF THE INVENTION

This invention relates to a high-intensity LED epitaxial substrate, which is of the type having a double-hetero structure, manufactured by joint use of vapor phase epitaxy (an MOCVD process or MBE process) and liquid phase epitaxy (an LPE process), and to a method of manufacturing the substrate.

In order to epitaxially grow a substrate for, say, a red-light emitting high-intensity LED in the prior art, first a p-type layer of $Al_{0.75}Ga_{0.25}As$ is formed as a p-type cladding layer to a thickness of 200 microns on a p-type GaAs substrate [(100) surface] by the LPE process. This is followed by forming a p-type $Al_{0.35}Ga_{0.65}As$ layer as a p-type active layer to a thickness of 2–3 microns, and then an n-type Te-doped $Al_{0.75}Ga_{0.25}As$ layer as an n-type cladding layer to a thickness of 50 microns. Next, a GaAs substrate-selective etchant (e.g., $NH_4OH:H_2O_2 = 1.7$) is used to remove the light-absorptive GaAs substrate, thereby providing a high-intensity LED chip.

Though the LPE process exhibits a high growth rate and therefore is suitable for forming layers that are thick, it is difficult to control thickness and carrier concentration. Consequently, when an epitaxial substrate having a double-hetero structure is fabricated solely by the LPE process, a variance in thickness and carrier concentration within the wafer surface tends to occur when the active layer is formed. As a result, stable luminance cannot be obtained.

Furthermore, attempting to grow a mechanically strong and thick (about 200 microns) mixed-crystal substrate solely by the MOCVD or MBE process is impractical since it involves a prolonged period of time and high cost.

SUMMARY OF THE INVENTION

A principal object of the invention is to manufacture a high-quality and highly uniform epitaxial substrate in a highly efficient manner.

Another object of the invention is to make joint use of the MOCVD process or MBE process and the LPE process to exploit the advantages of both processes.

Still another object of the invention is to form a substrate, at a high rate of growth, in which the layer thickness and carrier concentration of an epitaxially grown layer are uniformalized.

A further object of the invention is to manufacture an epitaxial substrate which is high in quality, highly uniform and low in cost.

At the present time, epitaxial growth of a high-intensity LED substrate largely relies upon AlGaAs, and in most cases the LPE process is employed. The LPE process features a rapid rate of growth and therefore is advantageous in forming thick layers. Though it is effective to adopt a double-hetero structure in order to achieve a high-intensity LED, control of layer thickness involves considerable difficulties when relying upon the LPE process.

On the other hand, the MOCVD process or MBE process is advantageous for the epitaxial growth of a high-intensity LED substrate since epitaxial layer thickness can be accurately controlled for uniformity within the wafer surface while carrier concentration is also controlled.

In many cases, however, a GaAs substrate is used as the substrate for epitaxial growth. Therefore, when it is attempted to also obtain higher intensity light, it is necessary to remove the GaAs substrate owing to its visible light-absorbing property. Accordingly, attempting to grow a thick mixed-crystal substrate (e.g., a substrate having a thickness of about 200 microns) solely by the MOCVD process or MBE process in order to furnish mechanical strength involves considerable time and high cost. This makes the effort impractical.

The present invention combines the merit of the MOCVD or MBE process, namely the controllability of the layer thickness and carrier concentration of the epitaxially grown layer, with the merit of the LPE process, namely the high rate of growth. As shown in (a) of FIG. 1, an $n_+$-type contact layer 2, an n-type cladding layer 3, a p-type active layer 4, a p-type cladding layer 5 and an anti-oxidation layer 6 are formed on a compound semiconductor substrate 1 by vapor phase epitaxy, thereby forming a double-hetero structure. Next, as shown in (b) of FIG. 1, a thick epitaxial layer 7 is formed on the oxidation-preventing layer (removed by melt-back) by liquid phase epitaxy, after which the compound semiconductor substrate, which is highly absorptive of the wavelength of emitted light, is removed. This makes it possible to reduce cost greatly.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENT

An embodiment of the present invention will now be described with reference to the drawings.

Figure 1A:
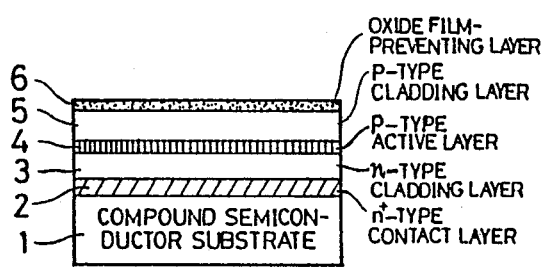
FIGS. 1(a) and 1(b) illustrate the structure of an epitaxially grown layer according to the present invention.
Figure 1B:
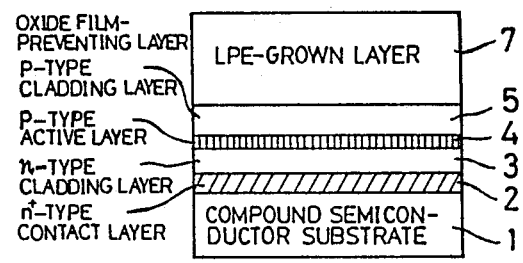
Figure 2:
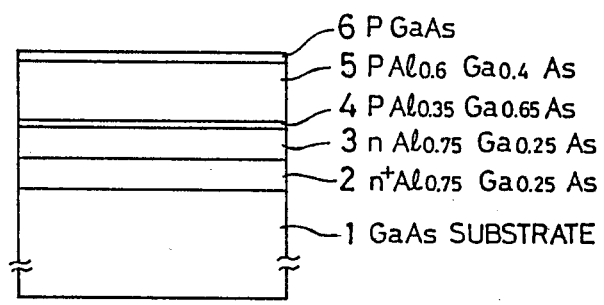
FIG. 2 is a view illustrating the structure of a grown layer in an embodiment of the invention.

FIG. 2 is a view illustrating an embodiment of the present invention. The structure shown in FIG. 2 includes a GaAs substrate 1, an $n_+$-type $Al_{0.75}Ga_{0.25}As$ layer 2, an n-type $Al_{0.75}Ga_{0.25}As$ cladding layer 3, a p-type $Al_{0.35}Ga_{0.65}As$ active layer 4, a p-type $Al_{0.6}Ga_{0.4}As$ cladding layer 5, and a p-type GaAs layer 6.

In a first step according to the present invention, an $n_+$-type $Al_{0.75}Ga_{0.25}As$ layer having a carrier concentration of $'33\ 10^{19}\ cm^{-3}$ and a thickness of 5 microns, an n-type $Al_{0.75}Ga_{0.25}As$ cladding layer having a carrier concentration of $2\times10^{17}\ cm^{-3}$ and a thickness of 5 microns, a p-type $Al_{0.35}Ga_{0.65}As$ active layer having a carrier concentration of $5\times10^{16}\ cm^{-3}$ and a thickness of 1 micron, a p-type $Al_{0.75}Ga_{0.25}As$ cladding layer having a carrier concentration of $1\times10^{18}\ cm^{-3}$ and a thickness of 10 microns, and a p-type GaAs layer having a carrier concentration of $1\times10^{18}\ cm^{-3}$ and a thickness of 1 micron are formed, in the order mentioned, on a 300 micron-thick GaAs substrate which is 2° off the (100) surface. These layers are formed by vapor phase epitaxy (an MOCVd process, MBE process, etc.) at a substrate temperature of 750° C. using trimethyl gallium [Ga(CH$_3$)$_3$], trimethyl aluminum [Al(CH$_3$)$_3$], hydrogen selenide (H$_2$Se) and diethyl zinc [C$_2$H$_5$)$_2$] as the gases.

Next, a Zn-doped, p-type Al$_{0.6}$Ga$_{0.4}$As layer having a carrier concentration of $1\times10^{18}$ cm$^{-3}$ and a thickness of 120 microns is formed on the substrate by an LPE process. The epitaxial conditions at this time are a temperature of 875° C., with the melt being GaAs: 32.0 mg, Zn: 1.7 mg, Al: 6.3 mg in 1 g of Ga. At this time the p-type GaAs layer 6 (1 micron) formed by MOCVD is completely removed by melt-back, and a p-type Al$_{0.75}$Ga$_{0.25}$As layer is formed anew.

Though the above embodiment is described in connection with an example in which a p-type Al$_{0.6}$Ga$_{0.4}$As layer is formed by the LPE process, it is not necessary to limit the invention to this material. The eptiaxial layer grown by the LPE process can be formed by any material that facilitates ohmic contact and that has a band gap less than that of the cladding layer of the double-hetero epitaxial layer and greater than that of double-hetero active layer so as not to absorb the emitted light.

Example for Purpose of Comparison

When the luminance of the LED chip fabricated in accordance with the present invention and the luminance of a conventional LED chip are compared in the wafer surface, the result is as shown in FIG. 3.

Figure 3A:
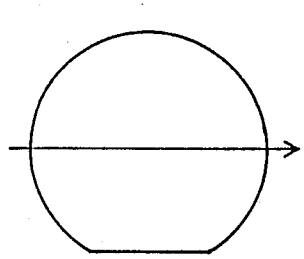
FIGS. 3(a) and 3(b) is a view in which luminance according to the invention is compared with that of the prior art.
Figure 3B:
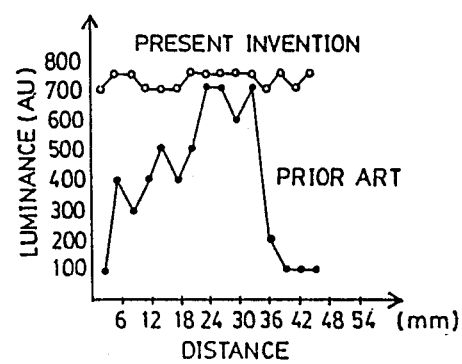

FIG. 3(b) illustrates luminance (in units which are arbitrary) in the direction of the chip shown in FIG. 3(a). In the present invention, it will be understood that uniformity in the surface (especially at the wafer periphery) is improved by forming the active layer uniformly, and that the luminance level is also improved.

Thus, in accordance with the invention as described above, uniformity of the double-hetero structure portion is improved by using the MOCVD process or MBE process, and a variance in luminance in the wafer surface can be reduced. In addition, by using the LPE process, the epitaxial substrate can be formed in a short period of time. Since the LPE-grown layer is only a single layer, the melt is of one type and it is possible to charge a number of sheets, as a result of which total cost can be reduced, in comparison with the conventional LPE process. Furthermore, since the GaAs substrate is removed an the n-type layer becomes the top layer, the requirement for mesa etching can be reduced to a thin 11 microns and yield can be raised when forming chips.

Further, the GaAs substrate surface is polished and exhibits a mirror surface on which vapor phase epitaxy is performed. Therefore, the n$^+$-type AlGaAs surface is obtained as a mirror surface when the GaAs is removed, and handling as at the time of pattern formation is comparatively simple. Flattening as by polishing is unnecessary.

As many apparently widely different embodiments of the present invention can be made without departing from the spirit and scope thereof, it is to be understood that the invention is not limited to the specific embodiments thereof except as defined in the appended claims.

What is claimed is:

1. An epitaxial substate for a high-intensity LED, comprising:
    a double-hetero structure epitaxial layer formed by vapor phase epitaxy; and
    an epitaxial layer formed by liquid phase epitaxy on said double-hetero structure epitaxial layer;
    said double-hetero structure epitaxial layer being formed by removing a compound semiconductor substrate after said double-hetero structure epitaxial layer has been formed thereon.

2. The epitaxial substrate according to claim 1, wherein the epitaxial layer formed by liquid phase epitaxy comprises a material having a band gap less than a band gap of a cladding layer of the double-hetero epitaxial layer and greater than a band gap of double-hetero active layer.

3. The epitaxial substrate according to claim 1, wherein the double-hetero epitaxial layer is formed by an n$^+$-type contact layer, an n-type cladding layer, a p-type active layer, a p-type cladding layer and an anti-oxidation layer in the order mentioned.

4. The epitaxial substrate according to claim 3, wherein the anti-oxidation layer is a GaAs layer.

5. The epitaxial substrate according to claim 3, wherein the n$^+$-type contact layer serves as a surface for forming an electrode when the substrate is removed.

6. The epitaxial substrate according to claims 3 or 4, wherein the anit-oxidation layer is removed when epitaxial growth is performed in the liquid phase.

7. A method of manufacturing an epitaxial substrate for a high-intensity LED, comprising:
    a first step of growing an epitaxial layer on a compound semiconductor substrate by vapor phase epitaxy;
    a second step of forming an anti-oxidation layer on the epitaxial layer;
    a third step of forming an epitaxial layer on the anit-oxidation layer; and
    a fourth step of removing the compound semiconductor substrate.

8. The method according to claim 7, wherein the epitaxial layer formed by vapor phase epitaxy is a double-hetero structure epitaxial layer.

9. The method according to claims 7 or 8, wherein the anti-oxidation layer is a GaAs layer.

* * * * *